(12) United States Patent
Cho et al.

(10) Patent No.: US 7,863,735 B1
(45) Date of Patent: Jan. 4, 2011

(54) INTEGRATED CIRCUIT PACKAGING SYSTEM WITH A TIERED SUBSTRATE PACKAGE AND METHOD OF MANUFACTURE THEREOF

(75) Inventors: NamJu Cho, Uiwang-si (KR); HeeJo Chi, Ichon si (KR); HanGil Shin, Seongnam-si (KR)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 12/538,098

(22) Filed: Aug. 7, 2009

(51) Int. Cl.
*H01L 23/34* (2006.01)
(52) U.S. Cl. .................. 257/723; 257/686; 257/778
(58) Field of Classification Search ............... 257/723, 257/778, 686, E23.011, E23.141, E21.502; 438/109, 124
See application file for complete search history.

(56) References Cited

U.S. PATENT DOCUMENTS 7,102,892 B2 * 9/2006 Kledzik et al. .............. 361/770
7,598,617 B2 * 10/2009 Lee et al. .................... 257/777
2007/0235215 A1 10/2007 Bathan et al.

OTHER PUBLICATIONS

U.S. Appl. No. 12/192,052, filed Aug. 14, 2008, Park et al.

* cited by examiner

*Primary Examiner*—Roy K Potter
(74) *Attorney, Agent, or Firm*—Mikio Ishimaru

(57) ABSTRACT

A method of manufacture of an integrated circuit packaging system includes: providing a base substrate; applying a tiered encapsulant above the base substrate, the tiered encapsulant having a first cavity above the base substrate and a second cavity above the first cavity adjacent an intermediate horizontal side; connecting an intermediate interconnect to the base substrate, the intermediate interconnect surrounded by the tiered encapsulant and substantially exposed on the intermediate horizontal side; and connecting a top interconnect to the base substrate, the top interconnect surrounded by the tiered encapsulant and substantially exposed on a top horizontal side.

20 Claims, 7 Drawing Sheets

INTEGRATED CIRCUIT PACKAGING SYSTEM WITH A TIERED SUBSTRATE PACKAGE AND METHOD OF MANUFACTURE THEREOF

TECHNICAL FIELD

The present invention relates generally to an integrated circuit packaging system, and more particularly to a system for multiple packages within an integrated circuit packaging system.

BACKGROUND ART

The demand for high density and high output/input integrated circuit packages dramatically increased with the trend of electronic products toward lightweight, small size, multifunction, and high speed. Therefore, components in the package are becoming thinner and thinner to reduce the size of the whole package effectively. Electronic products such as cell phone base products, global positioning systems (GPS), satellites, communication equipment, consumer products, and a vast line of other similar products are in ever increasing global demand.

Products must compete in world markets and attract many consumers or buyers in order to be successful. It is very important for products to continue to improve in features, performance, and reliability while reducing product costs, product size, and equally important to be available quickly for purchase by the consumers or buyers.

A small product, such as a cell phone, can contain many integrated circuit packages, each having different sizes and shapes. Each of the integrated circuit packages within the cell phone can contain large amounts of complex circuitry. The circuitry within each of the integrated circuit packages work and communicate with other circuitry of other integrated circuit packages and electrical parts using electrical connections on circuit boards.

Time to market, reliability, the number of integrated circuit packages, and the number of electrical parts on the circuit boards inside a product are important to improving the features, performance, and reliability of any product. Furthermore, the ways the circuitry and electrical connections are implemented have a direct impact on the availability, reliability, and costs of products.

Attempts have failed to provide a complete solution addressing simplified manufacturing processing, time to market, improved reliability, reduced electrical parts on the circuit boards, and size reductions of the circuit boards with increased functionality, leveragability, and increased product features to the consumer.

Thus, an increasing need remains to reduce parts mounted on the circuit boards while increasing functionality. In view of the economic and technological challenges, it is increasingly critical that answers be found to these problems.

In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought after but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a base substrate; applying a tiered encapsulant above the base substrate, the tiered encapsulant having a first cavity above the base substrate and a second cavity above the first cavity adjacent an intermediate horizontal side; connecting an intermediate interconnect to the base substrate, the intermediate interconnect surrounded by the tiered encapsulant and substantially exposed on the intermediate horizontal side; and connecting a top interconnect to the base substrate, the top interconnect surrounded by the tiered encapsulant and substantially exposed on a top horizontal side.

The present invention provides an integrated circuit packaging system including: a base substrate; a tiered encapsulant applied above the base substrate, the tiered encapsulant having a first cavity above the base substrate and a second cavity above the first cavity adjacent an intermediate horizontal side; an intermediate interconnect connected to the base substrate, the intermediate interconnect surrounded by the tiered encapsulant and substantially exposed on the intermediate horizontal side; and a top interconnect connected to the base substrate, the top interconnect surrounded by the tiered encapsulant and substantially exposed on a top horizontal side.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
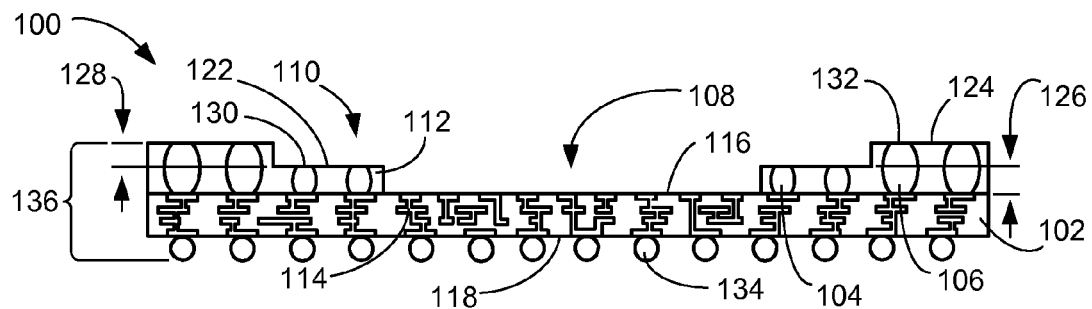
FIG. 1 is a cross-sectional view of an integrated circuit packaging system in a substrate assembly phase in a first embodiment of the present invention taken along a line 1-1 of FIG. 2.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown greatly exaggerated in the drawing FIGs. Similarly, although the views in the drawings shown for ease of description and generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the present invention, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Figure 2:
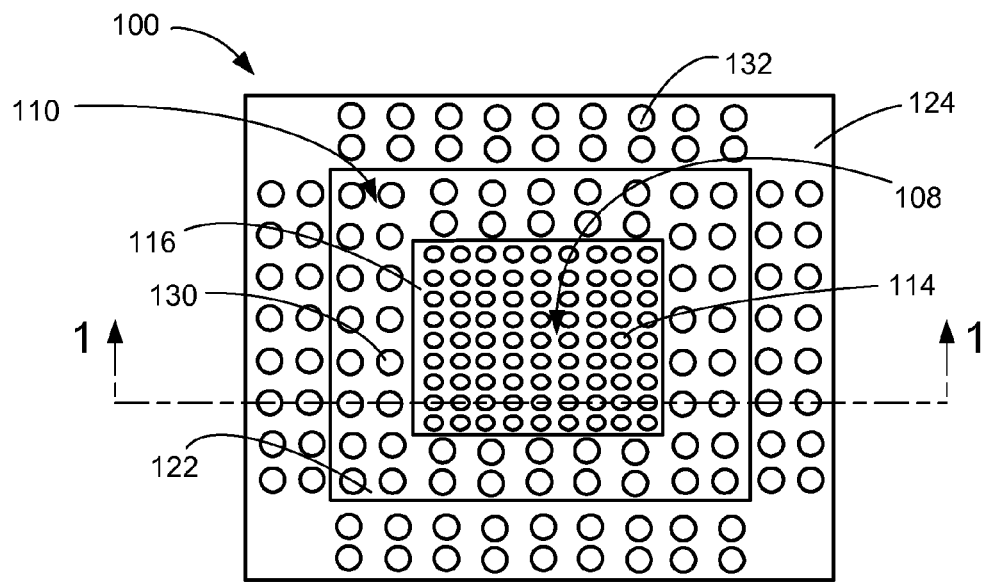
FIG. 2 is a top view of the structure of FIG. 1.

Referring now to FIG. 1, therein is shown a cross-sectional view of an integrated circuit packaging system 100 in a substrate assembly phase in a first embodiment of the present invention taken along a line 1-1 of FIG. 2. The integrated circuit packaging system 100 can preferably include a base substrate 102, intermediate interconnects 104, top interconnects 106, a first cavity 108, a second cavity 110, and a tiered encapsulant 112.

The base substrate 102, such as a substrate with an embedded solder on pad (e-SOP), a substrate, an interposer, a circuit board, or a laminate can include a conductive material 114. The base substrate 102 includes an inner base side 116 opposite an outer base side 118.

The conductive material 114, such as trace, wires, or redistribution layers, can be exposed on the inner base side 116, the outer base side 118, or embedded within the base substrate 102. The conductive material 114, having any shape, size, orientation, or distribution, can provide conductivity through the base substrate 102.

The tiered encapsulant 112, such as an encapsulant of an epoxy, an epoxy blend, a silicone material, a polymide, or similar compound material, can cover a portion of the inner base side 116 and can preferably have shaped sides such as staircase, vertically offset, or vertically layered shaped sides.

The tiered encapsulant 112 can include an intermediate horizontal side 122 parallel to and above the inner base side 116 and having the first cavity 108, such as an open area through hole, through depression, or through opening. The first cavity 108 can be above, on, or include a portion of the inner base side 116 substantially exposed adjacent the tiered encapsulant 112.

The tiered encapsulant 112 can include a top horizontal side 124 parallel to, offset from, and above the intermediate horizontal side 122 of the tiered encapsulant 112. The second cavity 110 of the top horizontal side 124, similar to the first cavity 108 except formed above the intermediate horizontal side 122 and the first cavity 108, can expose the intermediate horizontal side 122, the first cavity 108, and the portion of the inner base side 116 substantially exposed adjacent the tiered encapsulant 112.

The intermediate interconnects 104, such as an embedded solder on pad (e-SOP), a conductive fill, a conductive post, a conductive pin, or any combination thereof, can have a cross-sectional shape with non-vertical sides or sides of any shape. An end of the intermediate interconnects 104 connected to the conductive material 114 of the base substrate 102 can be used to couple or connect an intermediate contact end 130 of the intermediate interconnects 104, above the base substrate 102, with the base substrate 102.

The top interconnects 106, similar to the intermediate interconnects 104 except having lengths greater than the lengths of the intermediate interconnects 104, can be used to couple or connect a top contact end 132 of the top interconnects 106, above the base substrate 102, to the base substrate 102. An end of the top interconnects 106, opposite the top contact end 132, can connect to the conductive material 114 of the base substrate 102 to provide connectivity between the base substrate 102 and the top contact end 132.

The tiered encapsulant 112 can surround the intermediate interconnects 104 and the top interconnects 106. The intermediate contact end 130 can be substantially exposed on the intermediate horizontal side 122. The top contact end 132 can be substantially exposed on the top horizontal side 124. The intermediate interconnects 104 or the top interconnects 106 can be surrounded by the tiered encapsulant 112 during a process such as an encapsulation process.

A first z-height distance 126 can be defined as the vertical distance between the intermediate horizontal side 122 and the inner base side 116. The first z-height distance 126 can be equal to or greater than a z-height of a first component, such as a flip chip die, an integrated circuit die, an integrated circuit device, a substrate, an interposer, a circuit board, a passive component, or any combination of similar components.

A second z-height distance 128 can be defined as the vertical distance between the top horizontal side 124 and the intermediate horizontal side 122. The second z-height distance 128, can be equal to or greater than a z-height of a second component, such as another of the first component.

System connectors 134, such as balls, bumps, pins, posts, leads, or other connectors, can be attached to the conductive material 114 exposed on the outer base side 118 of the base substrate 102. The system connectors 134 can be used to connect the integrated circuit packaging system 100 to a next level of system integration such as a printed circuit board.

The resulting assembly including the base substrate 102, the tiered encapsulant 112, the intermediate interconnects 104, the top interconnects 106, and the system connectors 134 can be referred to as a base substrate unit 136.

It has been discovered that the base substrate unit 136 can improve the yield and reduce costs in the manufacture of the integrated circuit packaging system 100. The connections between the base substrate 102, the system connectors 134, the intermediate contact end 130, or the top contact end 132 can be completely tested for open or shorts (O/S) and visually inspected prior to unit integration. The resulting pre-tested unit, such as a known good (KG) unit or a known good e-SOP substrate significantly improves quality or reduces assembly costs of the integrated circuit packaging system 100.

Referring now to FIG. 2, therein is shown a top view of the structure of FIG. 1. Shown is some of the conductive material 114 exposed on the inner base side 116 within the first cavity 108. The second cavity 110 is shown exposing the first cavity 108 and the intermediate contact end 130 exposed on the intermediate horizontal side 122 above and surrounding the first cavity 108. The second cavity 110 is shown surrounded by the top contact end 132 exposed on the top horizontal side 124 above the second cavity 110.

Figure 3:
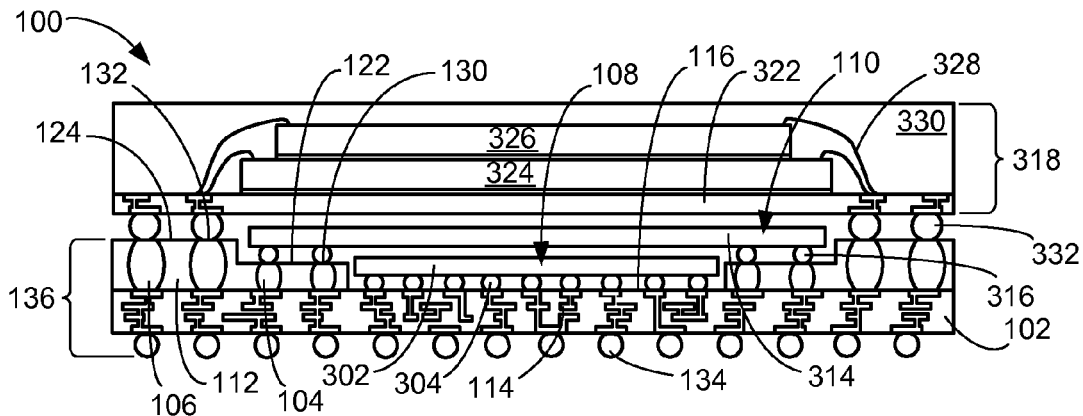
FIG. 3 is the cross-sectional view of the integrated circuit packaging system in an integration phase.

Referring now to FIG. 3, therein is shown the cross-sectional view of the integrated circuit packaging system 100 in an integration phase. A base module 302, such as a flip chip die, an integrated circuit die, an integrated circuit device, a substrate, an interposer, a circuit board, a passive component, or any combination of similar components, can be mounted over or within the first cavity 108.

First module connectors 304, such as solder, solder balls, or solder bumps, or leads, can be used to connect the base module 302 to the conductive material 114 exposed on the inner base side 116 of the base substrate 102 within the first cavity 108.

A stack module 314, similar to the base module 302 except having planar dimensions larger than planar dimensions of the base module 302, can be mounted over the base module 302. Stack module connectors 316, such as the first module connectors 304, can be used to connect the stack module 314 with the intermediate contact end 130 of the intermediate interconnects 104 substantially exposed on the intermediate horizontal side 122 of the tiered encapsulant 112 within the second cavity 110.

A top package 318, such as a multiple chip package, a multiple package device, a flip chip die, a leaded package, a passive device, or a substrate, can be mounted or connected over the base substrate unit 136. The top package 318 can include a top package substrate 322, a first die 324 over the top package substrate 322, and a second die 326 over the first die 324.

Circuitry of the first die 324 and the second die 326 can be connected to a side of the top package substrate 322 using package connectors 328, such as wires, leads, or other conductors. A top package encapsulant 330, such as an epoxy, an epoxy blend, a silicone material, a polymide, or similar compound material, can cover the first die 324, the second die 326, the package connectors 328, and the side of the top package substrate 322.

Top package connectors 332 such as solder, solder balls, or solder bumps, or leads can connect a side of the top package substrate 322 opposite the side covered with the top package encapsulant 330 to the top contact end 132 of the top interconnects 106 substantially exposed on the top horizontal side 124 of the tiered encapsulant 112. The top package connectors 332 can optionally be used to connect the top package 318 to the intermediate contact end 130 of the intermediate horizontal side 122.

The top package 318, the stack module 314, and the base module 302 can be mounted on to a pre-tested KG e-SOP substrate unit, such as the base substrate unit 136, that has passed open/short (O/S) tests and visual checks before step multiple tier (SMT) processing. For better productivity, strip level processing is preferred.

It has been found that use of KG substrate units can significantly reduce assembly cost and risk of yield loss. It has been determined that the present invention provides for lower overall package profiles than profiles of three-tiered fan in packages on package (Fi-PoP) and better heat dissipation than over-mold packages over package bottom embedded solder on pad (PoPb-eSOP).

Furthermore, it has been found that the present invention is free from potential die crack risks, such as cracks by mold chase in flip chip packages on package embedded solder on pad (fcPoPb-eSOP) with exposed die.

It has been discovered that the tiered encapsulant 112 formed with the first cavity 108 and the second cavity 110 can provide significant packaging reliability. Mounting or connecting the base module 302 within the first cavity 108, mounting or connecting the stack module within the second cavity 110, and mounting or connecting the top package 318 over the base substrate unit 136 can significantly improve the structural characteristics of the present invention. Thermal and mechanical induced stress are distributed and reduced resulting in a significant reduction in failures such as die cracking, substrate warpage, trace distortion from compression and tension, or improper thermal distribution.

Figure 4:
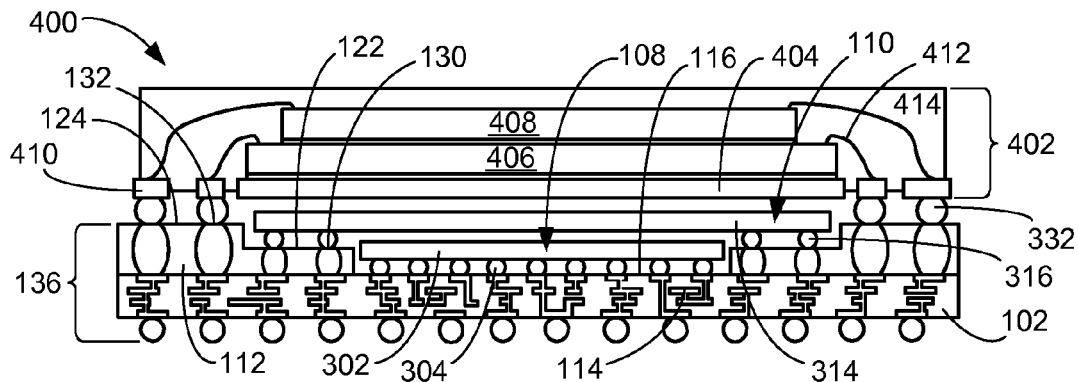
FIG. 4 is a cross-sectional view of an integrated circuit packaging system in a second embodiment of the present invention.

Referring now to FIG. 4, therein is shown a cross-sectional view of an integrated circuit packaging system 400 in a second embodiment of the present invention. The integrated circuit packaging system 400 is similar to the integrated circuit packaging system 100 of FIG. 3 except the integrated circuit packaging system 400 includes a top package 402.

The top package 402, such as a leaded package, a multiple chip package, a multiple package device, flip chip die, a passive device, or a substrate, can be mounted or connected over the base substrate unit 136. The top package 402 can include a die paddle 404, a first die 406 over the die paddle 404, and a second die 408 over the first die 406.

Circuitry of the first die 406 and the second die 408 can be connected to leads 410 surrounding the die paddle 404 using package connectors 412, such as wires, leads, or other conductors. A top package encapsulant 414, such as an epoxy, an epoxy blend, a silicone material, a polymide, or similar compound material, can cover the first die 406, the second die 408, the package connectors 328, and a side of the leads 410.

The top package connectors 332 can connect a side of the leads opposite the side covered with the top package encapsulant 414 to the top contact end 132 substantially exposed on the top horizontal side 124 of the tiered encapsulant 112. The top package connectors 332 can optionally be used to connect the top package 402 to the intermediate contact end 130 of the intermediate horizontal side 122.

The stack module 314, below the top package 402, is shown connected to the intermediate contact end 130 substantially exposed on the intermediate horizontal side 122 within the second cavity 110 of the tiered encapsulant 112 using the stack module connectors 316.

The base module 302, below the stack module 314, is shown connected to the conductive material 114 exposed on the inner base side 116 of the base substrate 102 and over or within the first cavity 108 of the tiered encapsulant 112 using the first module connectors 304.

Figure 5:
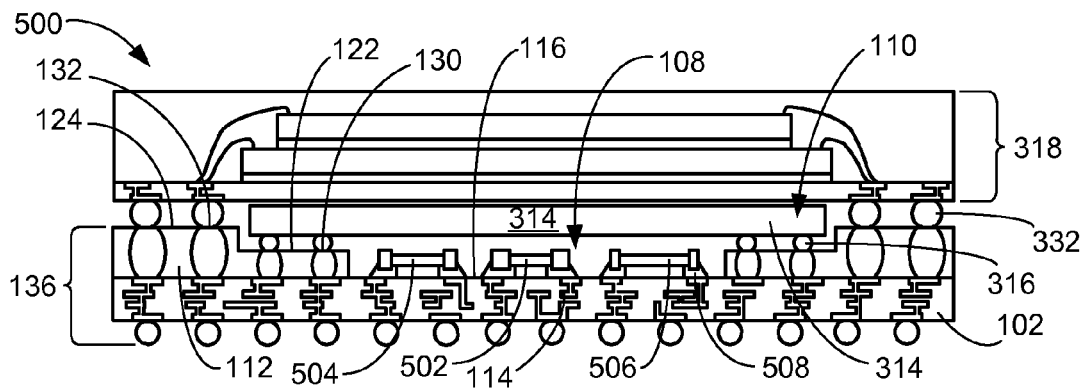
FIG. 5 is a cross-sectional view of an integrated circuit packaging system in a third embodiment of the present invention.

Referring now to FIG. 5, therein is shown a cross-sectional view of an integrated circuit packaging system 500 in a third embodiment of the present invention. The integrated circuit packaging system 500 is similar to the integrated circuit packaging system 100 of FIG. 3 except the integrated circuit packaging system 500 includes a first passive device 502, such as a passive component, a resistor, a capacitor, an inductor, a resettable fuse, a sensor, or a similar passive device, a second passive device 504, and a third passive device 506.

The first passive device 502, the second passive device 504, such as another of the first passive device 502, and the third passive device 506, such as another of the first passive device 502, can be mounted centrally within the first cavity 108 of the tiered encapsulant 112. The second passive device 504 can be mounted within the first cavity 108 of the tiered encapsulant 112 and having an offset away from the first passive device 502.

The third passive device 506 can be mounted within the first cavity 108 of the tiered encapsulant 112 and having an offset away from the first passive device 502 and the second passive device 504.

The first passive device 502, the second passive device 504, or the third passive device 506, can be connected to the conductive material 114 exposed on the inner base side 116 of the base substrate 102 using first module connectors 508, such as solder, solder balls, or solder bumps, or leads.

The stack module 314 is shown mounted over the first passive device 502, the second passive device 504, and the third passive device 506. The stack module connectors 316 can connect the stack module 314 with the intermediate contact end 130 substantially exposed on the intermediate horizontal side 122 within the second cavity 110 of the tiered encapsulant 112.

The top package 318 is shown mounted over the base substrate unit 136 and connected to the top contact end 132 substantially exposed on the top horizontal side 124 of the tiered encapsulant 112 using the top package connectors 332. The top package connectors 332 can optionally be used to connect the top package 318 to the intermediate contact end 130 of the intermediate horizontal side 122.

Figure 6:
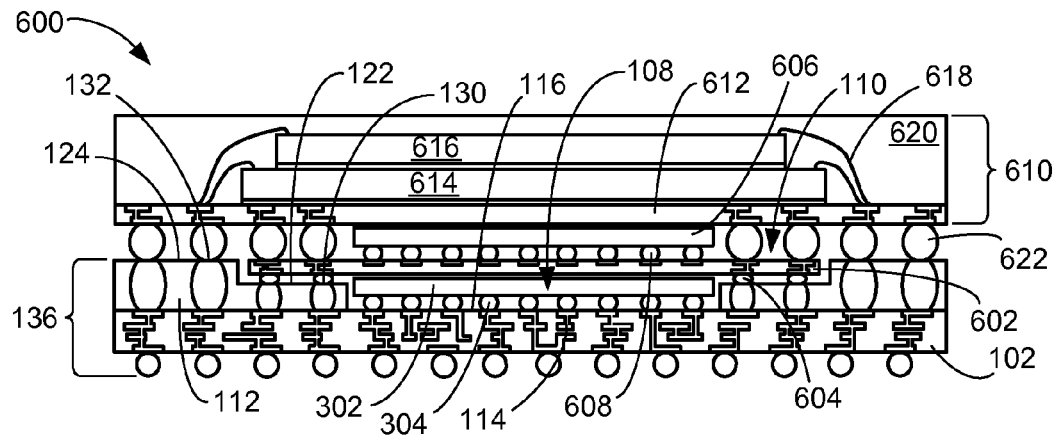
FIG. 6 is a cross-sectional view of an integrated circuit packaging system in a fourth embodiment of the present invention.

Referring now to FIG. 6, therein is shown a cross-sectional view of an integrated circuit packaging system 600 in a fourth embodiment of the present invention. The integrated circuit packaging system 600 is similar to the integrated circuit packaging system 100 of FIG. 3 except the integrated circuit packaging system 600 includes a stack substrate 602, stack module connectors 604, a stack module 606, substrate connectors 608, and a top package 610.

The base module 302 is shown mounted over or within the first cavity 108 using the first module connectors 304 to connect the base module 302 to the conductive material 114 exposed on the inner base side 116 of the base substrate 102 within the first cavity 108 of the tiered encapsulant 112.

The stack substrate 602 can be mounted over the base module 302. The stack module connectors 604, such as solder, solder balls, or solder bumps, or leads, can connect a side of the stack substrate 602, such as a substrate, an interposer, a circuit board, or a laminate, to the intermediate contact end 130 substantially exposed on the intermediate horizontal side 122 within the second cavity 110 of the tiered encapsulant 112.

The side of the stack substrate 602 connected directly to the stack module connectors 604 can have connectivity with a side of the stack substrate 602 opposite the side with the stack module connectors 604 using conductive materials within and on the stack substrate 602. The side of the stack substrate 602 opposite the side with the stack module connectors 604 can be connected to an active side of the stack module 606, such as another of the base module 302, using the substrate connectors 608 such as solder balls.

The top package 610, such as a multiple chip package, a multiple package device, a flip chip die, a leaded package, a passive device, or a substrate, can be mounted or connected over the base substrate unit 136. The top package 610 can include a top package substrate 612, a first die 614 over the top package substrate 612, and a second die 616 over the first die 614.

Circuitry of the first die 614 and the second die 616 can be connected to a side of the top package substrate 612 using package connectors 618, such as wires, leads, or other conductors. A top package encapsulant 620, such as an epoxy, an epoxy blend, a silicone material, a polymide, or similar compound material, can cover the first die 614, the second die 616, the package connectors 618, and the side of the top package substrate 612.

The top package 610 can be mounted or connected over the stack module 606. Top package connectors 622, such as solder, solder balls, or solder bumps, or leads, can be used to provide direct connectivity between the top package 610 and the top contact end 132 substantially exposed on the top horizontal side 124 of the tiered encapsulant 112 or a portion of the stack substrate 602. The top package connectors 622 can optionally be used to connect the top package 610 to the intermediate contact end 130 of the intermediate horizontal side 122.

Figure 7:
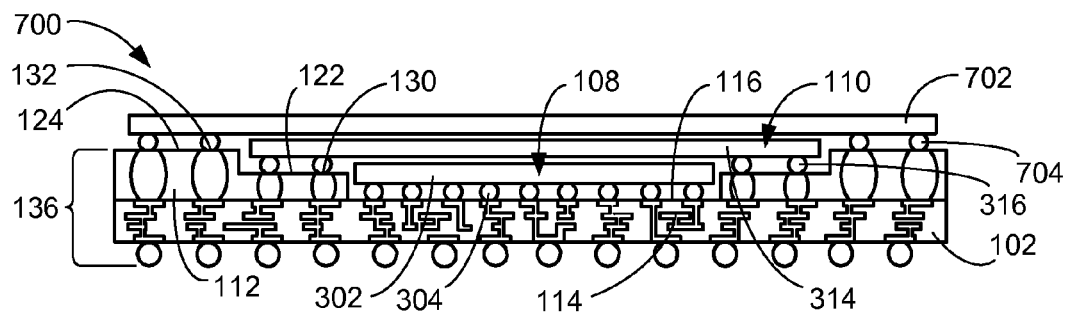
FIG. 7 is a cross-sectional view of an integrated circuit packaging system in a fifth embodiment of the present invention.

Referring now to FIG. 7, therein is shown a cross-sectional view of an integrated circuit packaging system 700 in a fifth embodiment of the present invention. The integrated circuit packaging system 700 is similar to the integrated circuit packaging system 100 of FIG. 3 except the integrated circuit packaging system 700 includes a top package 702.

The top package 702, such as a flip chip die, a leaded package, a multiple chip package, a multiple package device, a passive device, or a substrate, can be mounted or connected over the base substrate unit 136. Top package connectors 704, such as solder, solder balls, or solder bumps, or leads, can connect an active side of the top package 702 to the top contact end 132 substantially exposed on the top horizontal side 124 of the tiered encapsulant 112.

The top package connectors 704 can optionally be used to connect the top package 702 to the intermediate contact end 130 of the intermediate horizontal side 122. The stack module 314, below the top package 702, is shown connected to the intermediate contact end 130 substantially exposed on the intermediate horizontal side 122 within the second cavity 110 of the tiered encapsulant 112 using the stack module connectors 316.

The base module 302, below the stack module 314, is shown connected to the conductive material 114 exposed on the inner base side 116 of the base substrate 102 and over or within the first cavity 108 of the tiered encapsulant 112 using the first module connectors 304.

Any package structures from combination of key features from the first embodiment, the second embodiment, the third embodiment, the fourth embodiment, or the fifth embodiment can be applicable.

Figure 8:
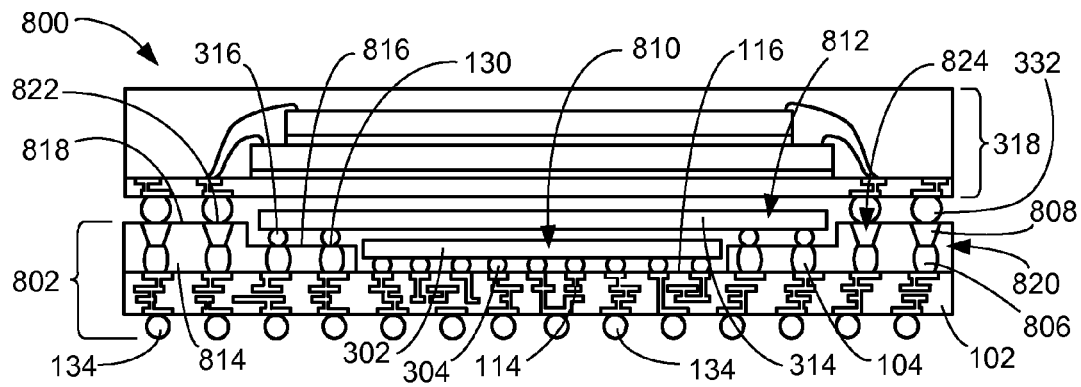
FIG. 8 is a cross-sectional view of an integrated circuit packaging system in a sixth embodiment of the present invention.

Referring now to FIG. 8, therein is shown a cross-sectional view of an integrated circuit packaging system 800 in a sixth embodiment of the present invention. The integrated circuit packaging system 800 is similar to the integrated circuit packaging system 100 of FIG. 3 except the integrated circuit packaging system 800 includes a base substrate unit 802.

The base substrate unit 802 can include the base substrate 102, the intermediate interconnects 104, lower interconnects 806, upper interconnects 808, a first cavity 810, a second cavity 812, and a tiered encapsulant 814.

The tiered encapsulant 814, such as an encapsulant of an epoxy, an epoxy blend, a silicone material, a polymide, or similar compound material, can cover a portion of the inner base side 116 and can preferably have shaped sides such as staircase, vertically offset, or vertically layered shaped sides.

The tiered encapsulant 814 can include an intermediate horizontal side 816 parallel to the inner base side 116 and the first cavity 810, such as an open area through hole, through depression, or through opening. The first cavity 810 can be above, on, or include a portion of the inner base side 116 substantially exposed adjacent the tiered encapsulant 814.

The tiered encapsulant 814 can include a top horizontal side 818 parallel to, offset from, and above the intermediate horizontal side 816 of the tiered encapsulant 814. The second cavity 812 of the top horizontal side 818, similar to the first cavity 810 except formed above the intermediate horizontal side 816 and the first cavity 810, can expose the intermediate horizontal side 816, the first cavity 810, and the portion of the inner base side 116 substantially exposed adjacent the tiered encapsulant 814.

The intermediate interconnects 104, such as an embedded solder on pad (e-SOP), a conductive fill, a conductive post, a conductive pin, or any combination thereof, can have a cross-sectional shape with non-vertical sides or sides of any shape. An end of the intermediate interconnects 104 connected to the conductive material 114 of the base substrate 102 can be used to couple or connect the intermediate contact end 130 of the intermediate interconnects 104, above the base substrate 102, with the base substrate 102.

The tiered encapsulant 814 can surround the intermediate interconnects 104 and the intermediate contact end 130 can be substantially exposed on the intermediate horizontal side 816. The lower interconnects 806, such as an embedded solder on pad (e-SOP), a conductive fill, a conductive post, a conductive pin, or any combination thereof, can have sizes or shapes identical to sizes or shapes of the intermediate interconnects 104 and connect to the conductive material 114 of the base substrate 102.

The lower interconnects 806 can be connected to the upper interconnects 808, such as a conductive fill, a conductive post, a conductive pin, an e-SOP, or any combination thereof, to form top interconnects 820 having a cross-sectional shape with non-vertical sides or sides of any shape.

An end of the upper interconnects 808 can be used to form a top contact end 822 of the top interconnects 820. Lengths of the top interconnects 820 can be greater than lengths of the intermediate interconnects 104. An end of the top interconnects 820 connected to the conductive material 114 of the base substrate 102 can be used to couple or connect the top contact end 822 of the top interconnects 820, above the base substrate 102, with the base substrate 102.

The tiered encapsulant 814 can surround the top interconnects 820 and the top contact end 822 can be substantially exposed on the top horizontal side 818. Top through holes 824 on the top horizontal side 818 and through the tiered encapsulant 814 above the lower interconnects 806 can be formed using a removal process such as drilling, etching, laser ablation, mechanical drilling, chemical etching, or similar removal process.

The top through holes 824, each having cross-sectional areas with non-vertical sides or sides of any shape, can extend from each of the lower interconnects 806, through the tiered encapsulant 814, or above the top horizontal side 818. The upper interconnects 808 can be formed or inserted in the top through holes 824 on to the lower interconnects 806 of the top interconnects 820 using a process such as a reflow or insertion process.

An end of the upper interconnects 808 opposite the top contact end 822 can be connected to the lower interconnects 806. The system connectors 134 can be attached to the conductive material 114 exposed on the outer base side 118 of the base substrate 102 to connect the integrated circuit packaging system 800 to a next level of system integration such as a printed circuit board.

The base module 302 can be mounted over or within the first cavity 810 and connected to the conductive material 114 exposed on the inner base side 116 of the base substrate 102 using the first module connectors 304.

The stack module 314 can be mounted over the base module 302 and connected with the intermediate contact end 130 substantially exposed on the intermediate horizontal side 816 of the tiered encapsulant 814 within the second cavity 812 using the stack module connectors 316.

The top package 318 can be mounted or connected, over the base substrate unit 802, to the top contact end 822 substantially exposed on the top horizontal side 818 of the tiered encapsulant 814 using the top package connectors 332. The top package connectors 332 can optionally be used to connect the top package 318 to the intermediate contact end 130 of the intermediate horizontal side 122.

The present embodiment can use of same size solder balls, such as the intermediate interconnects 104 or the lower interconnects 806, for forming an e-SOP substrate. After molding, mold via holes, such as the top through holes 824, can be formed by laser ablation, mechanical drilling, or chemical etching. A gap filling processes, such as solder ball pick/drop or solder past printing, or etc, can also follow the molding.

Figure 9:
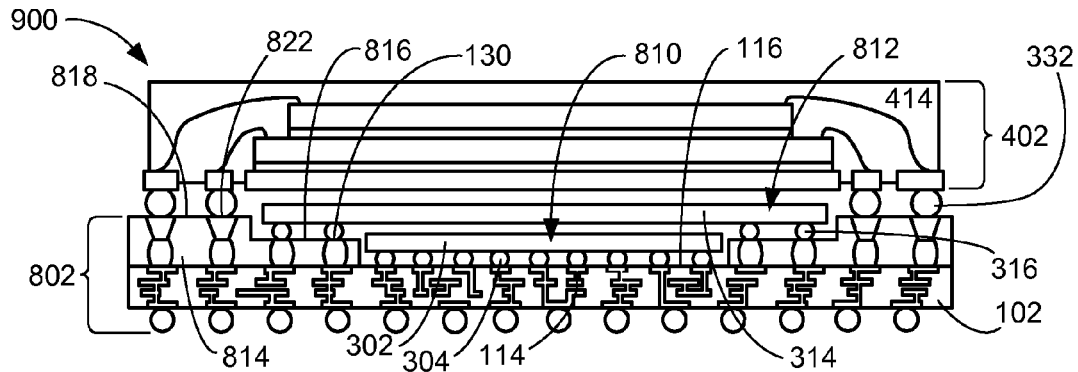
FIG. 9 is a cross-sectional view of an integrated circuit packaging system in a seventh embodiment of the present invention.

Referring now to FIG. 9, therein is shown a cross-sectional view of an integrated circuit packaging system 900 in a seventh embodiment of the present invention. The integrated circuit packaging system 900 is similar to the integrated circuit packaging system 800 of FIG. 8 except the integrated circuit packaging system 900 includes the top package 402.

The top package 402 can be mounted or connected over the base substrate unit 802 with the top package connectors 332. The top package connectors 332 can connect the side of the leads opposite the side covered with the top package encapsulant 414 to the top contact end 822 substantially exposed on the top horizontal side 818 of the tiered encapsulant 814.

The top package connectors 332 can optionally be used to connect the top package 402 to the intermediate contact end 130 of the intermediate horizontal side 816. The stack module 314, below the top package 402, is shown connected to the intermediate contact end 130 substantially exposed on the intermediate horizontal side 816 within the second cavity 812 of the tiered encapsulant 814 using the stack module connectors 316.

The base module 302, below the stack module 314, is shown connected to the conductive material 114 exposed on the inner base side 116 of the base substrate 102 and over or within the first cavity 810 of the tiered encapsulant 814 using the first module connectors 304.

Figure 10:
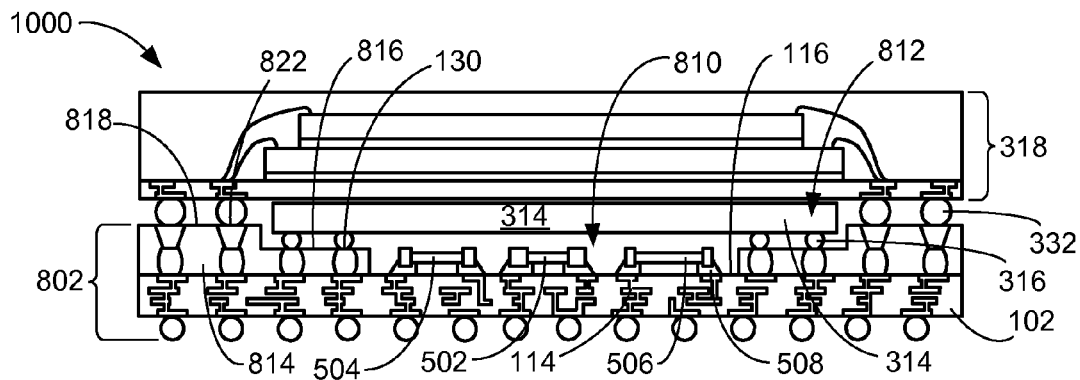
FIG. 10 is a cross-sectional view of an integrated circuit packaging system in an eighth embodiment of the present invention.

Referring now to FIG. 10, therein is shown a cross-sectional view of an integrated circuit packaging system 1000 in an eighth embodiment of the present invention. The integrated circuit packaging system 1000 is similar to the integrated circuit packaging system 800 of FIG. 8 except the integrated circuit packaging system 1000 includes the first passive device 502, the second passive device 504, and the third passive device 506.

The first passive device 502 can be mounted centrally within the first cavity 810 of the tiered encapsulant 814. The second passive device 504 can be mounted within the first cavity 810 of the tiered encapsulant 814 and having an offset away from the first passive device 502.

The third passive device 506 can be mounted within the first cavity 810 of the tiered encapsulant 814 and having an offset away from the first passive device 502 and the second passive device 504. The first passive device 502, the second passive device 504, or the third passive device 506, can be connected to the conductive material 114 exposed on the inner base side 116 of the base substrate 102 using the first module connectors 508.

The stack module 314 is shown mounted over the first passive device 502, the second passive device 504, and the third passive device 506. The stack module connectors 316 can connect the stack module 314 with the intermediate contact end 130 substantially exposed on the intermediate horizontal side 816 within the second cavity 812 of the tiered encapsulant 814.

The top package 318 is shown mounted over the base substrate unit 802 and connected to the top contact end 822 substantially exposed on the top horizontal side 818 of the tiered encapsulant 814 using the top package connectors 332. The top package connectors 332 can optionally be used to connect the top package 318 to the intermediate contact end 130 of the intermediate horizontal side 816.

Figure 11:
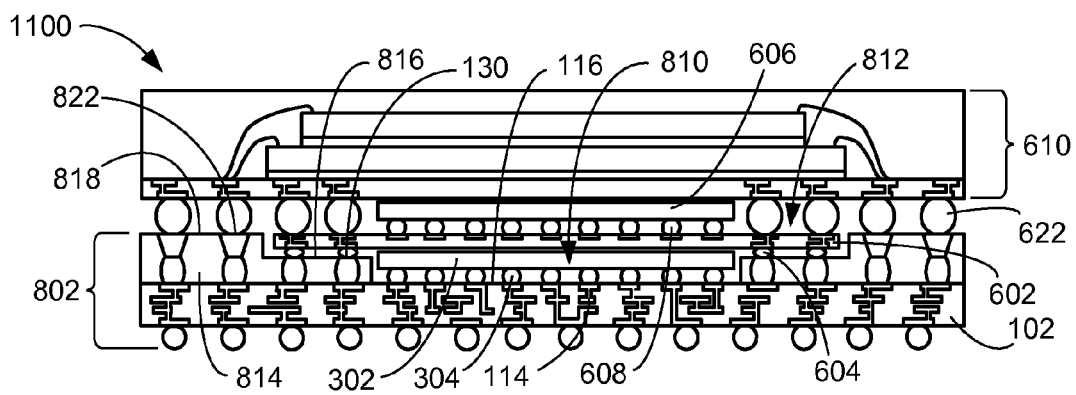
FIG. 11 is a cross-sectional view of an integrated circuit packaging system in a ninth embodiment of the present invention.

Referring now to FIG. 11, therein is shown a cross-sectional view of an integrated circuit packaging system 1100 in a ninth embodiment of the present invention. The integrated circuit packaging system 1100 is similar to the integrated circuit packaging system 800 of FIG. 8 except the integrated circuit packaging system 1100 includes the stack substrate 602, the stack module connectors 604, the stack module 606, the substrate connectors 608, and the top package 610.

The base module 302 is shown mounted over or within the first cavity 810 of the tiered encapsulant 814 using the first module connectors 304 to connect the base module 302 to the conductive material 114 exposed on the inner base side 116 of the base substrate 102.

The stack substrate 602 can be mounted over the base module 302. The stack module connectors 604 can connect the side of the stack substrate 602 to the intermediate contact end 130 substantially exposed on the intermediate horizontal side 816 within the second cavity 110 of the tiered encapsulant 814. A side of the stack substrate 602 opposite the side with the stack module connectors 604 can be connected to an active side of the stack module 606 using the substrate connectors 608.

The top package 610 can be mounted or connected over the stack module 606 using the top package connectors 622. The top package connectors 622 can provide connectivity between the top package 610 and the top contact end 822 substantially exposed on the top horizontal side 818 of the tiered encapsulant 814 or a portion of the stack substrate 602. The top package connectors 662 can optionally be used to connect the top package 610 to the intermediate contact end 130 of the intermediate horizontal side 816.

Figure 12:
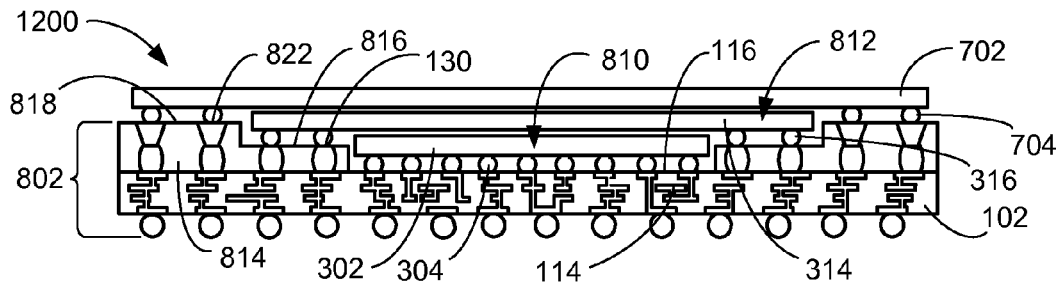
FIG. 12 is a cross-sectional view of an integrated circuit packaging system in a tenth embodiment of the present invention.

Referring now to FIG. 12, therein is shown a cross-sectional view of an integrated circuit packaging system 1200 in a tenth embodiment of the present invention. The integrated circuit packaging system 1200 is similar to the integrated circuit packaging system 800 of FIG. 8 except the integrated circuit packaging system 1200 includes the top package 702 mounted or connected over the base substrate unit 802.

The top package connectors 704 can connect an active side of the top package 702 to the top contact end 822 substantially exposed on the top horizontal side 818 of the tiered encapsulant 814. The top package connectors 704 can optionally be used to connect the top package 702 to the intermediate contact end 130 of the intermediate horizontal side 816.

The stack module 314, below the top package 702, is shown connected to the intermediate contact end 130 substantially exposed on the intermediate horizontal side 816 within the second cavity 812 of the tiered encapsulant 814 using the stack module connectors 316.

The base module 302, below the stack module 314, is shown connected to the conductive material 114 exposed on the inner base side 116 of the base substrate 102 and over or within the first cavity 810 of the tiered encapsulant 814 using the first module connectors 304.

Any package structures from combinations of key features from the sixth embodiment, the seventh embodiment, the eighth embodiment, the ninth embodiment, or the tenth embodiment can be applicable.

Figure 13:
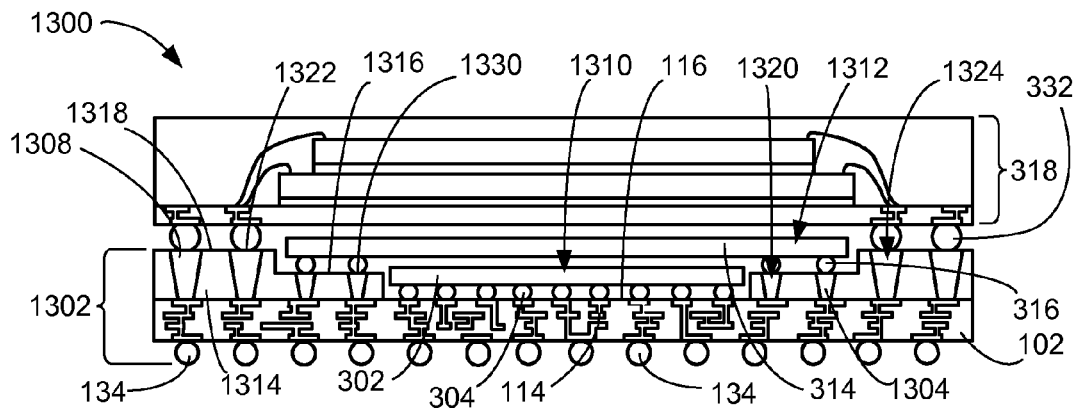
FIG. 13 is a cross-sectional view of an integrated circuit packaging system in an eleventh embodiment of the present invention.

Referring now to FIG. 13, therein is shown a cross-sectional view of an integrated circuit packaging system 1300 in an eleventh embodiment of the present invention. The integrated circuit packaging system 1300 is similar to the integrated circuit packaging system 100 of FIG. 3 except the integrated circuit packaging system 1300 includes a base substrate unit 1302.

The base substrate unit 1302 can include the base substrate 102, the intermediate interconnects 104, top interconnects 1308, a first cavity 1310, a second cavity 1312, and a tiered encapsulant 1314.

The tiered encapsulant 1314, such as an encapsulant of an epoxy, an epoxy blend, a silicone material, a polymide, or similar compound material, can cover a portion of the inner base side 116 and can preferably have shaped sides such as staircase, vertically offset, or vertically layered shaped sides.

The tiered encapsulant 1314 can include an intermediate horizontal side 1316 parallel to the inner base side 116 and the first cavity 1310, such as an open area through hole, through depression, or through opening. The first cavity 1310 can be above, on, or include a portion of the inner base side 116 substantially exposed adjacent the tiered encapsulant 1314.

The tiered encapsulant 1314 can include a top horizontal side 1318 parallel to, offset from, and above the intermediate horizontal side 1316 of the tiered encapsulant 1314. The second cavity 1312 of the top horizontal side 1318, similar to the first cavity 1310 except formed above the intermediate horizontal side 1316 and the first cavity 1310, can expose the intermediate horizontal side 1316, the first cavity 1310, and the portion of the inner base side 116 substantially exposed adjacent the tiered encapsulant 1314.

Intermediate through holes 1320 can be formed on the intermediate horizontal side 1316 and through the tiered encapsulant 1314 above the base substrate 102 using a removal process such as drilling, etching, laser ablation, mechanical drilling, chemical etching, or similar removal process.

The intermediate through holes 1320, each having cross-sectional areas with non-vertical sides or sides of any shape, can extend from the conductive material 114 of the base substrate 102, through the tiered encapsulant 1314, or above the intermediate horizontal side 1316.

Intermediate interconnects 1304, such as conductive fill, a conductive post, a conductive pin, an embedded solder on pad (e-SOP), or any combination thereof, can be formed or inserted in the intermediate through holes 1320 on to the conductive material 114 of the base substrate 102 using a process such as a reflow or insertion process.

The intermediate interconnects 1304 can be used to couple or connect an intermediate contact end 1330 of the intermediate interconnects 1304, above the base substrate 102, to the conductive material 114 of the base substrate 102. The intermediate contact end 1330 can be substantially exposed on the intermediate horizontal side 1316.

Top through holes 1324 can be formed on the top horizontal side 1318 and through the tiered encapsulant 1314 above the base substrate 102 using a removal process such as drilling, etching, laser ablation, mechanical drilling, chemical etching, or similar removal process.

The top through holes 1324, each having cross-sectional areas with non-vertical sides or sides of any shape, can extend from the base substrate 102, through the tiered encapsulant 1314, or above the top horizontal side 1318.

The top interconnects 1308, such as conductive fill, a conductive post, a conductive pin, an embedded solder on pad (e-SOP), or any combination thereof, can be formed or inserted in the top through holes 1324 on to the conductive material 114 of the base substrate 102 using a process such as a reflow or insertion process.

The top interconnects 1308 can be used to couple or connect a top contact end 1322 of the top interconnects 1308, above the base substrate 102, to the conductive material 114 of the base substrate 102. The top interconnects 1308 can have lengths greater than the lengths of the intermediate interconnects 1304. The top contact end 1322 can be substantially exposed on the top horizontal side 1318.

The system connectors 134 can be attached to the conductive material 114 exposed on the outer base side 118 of the base substrate 102 to connect the integrated circuit packaging system 1300 to a next level of system integration such as a printed circuit board.

The base module 302 can be mounted over or within the first cavity 1310 and connected to the conductive material 114 exposed on the inner base side 116 of the base substrate 102 using the first module connectors 304.

The stack module 314 can be mounted over the base module 302 and connected with the intermediate contact end 1330 substantially exposed on the intermediate horizontal side 1316 of the tiered encapsulant 1314 within the second cavity 1312 using the stack module connectors 316.

The top package 318 can be mounted or connected, over the base substrate unit 1302, to the top contact end 1322 substantially exposed on the top horizontal side 1318 of the tiered encapsulant 1314 using the top package connectors 332. The top package connectors 332 can optionally be used to connect the top package 318 to the intermediate contact end 1330 of the intermediate horizontal side 1316.

After molding mold via holes such as the top through holes 1324 or the intermediate through holes 1320 can be formed by laser ablation, mechanical drilling, or chemical etching. A gap filling processes, such as solder ball pick/drop or solder past printing, or etc, can also follow the molding of the mold via holes.

Figure 14:
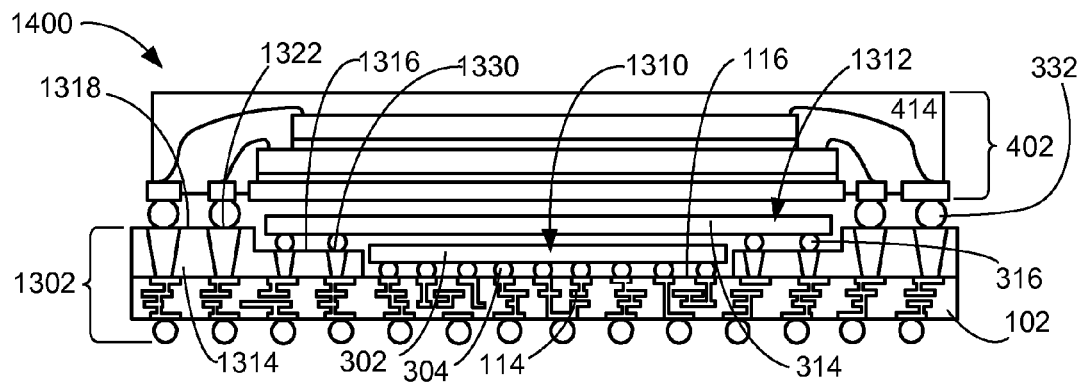
FIG. 14 is a cross-sectional view of an integrated circuit packaging system in a twelfth embodiment of the present invention.

Referring now to FIG. 14, therein is shown a cross-sectional view of an integrated circuit packaging system 1400 in a twelfth embodiment of the present invention. The integrated circuit packaging system 1400 is similar to the integrated circuit packaging system 1300 of FIG. 13 except the integrated circuit packaging system 1400 includes the top package 402.

The top package 402 can be mounted or connected over the base substrate unit 1302 with the top package connectors 332. The top package connectors 332 can connect the side of the leads opposite the side covered with the top package encapsulant 414 to the top contact end 1322 substantially exposed on the top horizontal side 1318 of the tiered encapsulant 1314. The top package connectors 332 can optionally be used to connect the top package 402 to the intermediate contact end 1330 of the intermediate horizontal side 1316.

The stack module 314, below the top package 402, is shown connected to the intermediate contact end 1330 substantially exposed on the intermediate horizontal side 1316 within the second cavity 1312 of the tiered encapsulant 1314 using the stack module connectors 316.

The base module 302, below the stack module 314, is shown connected to the conductive material 114 exposed on the inner base side 116 of the base substrate and over or within the first cavity 1310 of the tiered encapsulant 1314 using the first module connectors 304.

Figure 15:
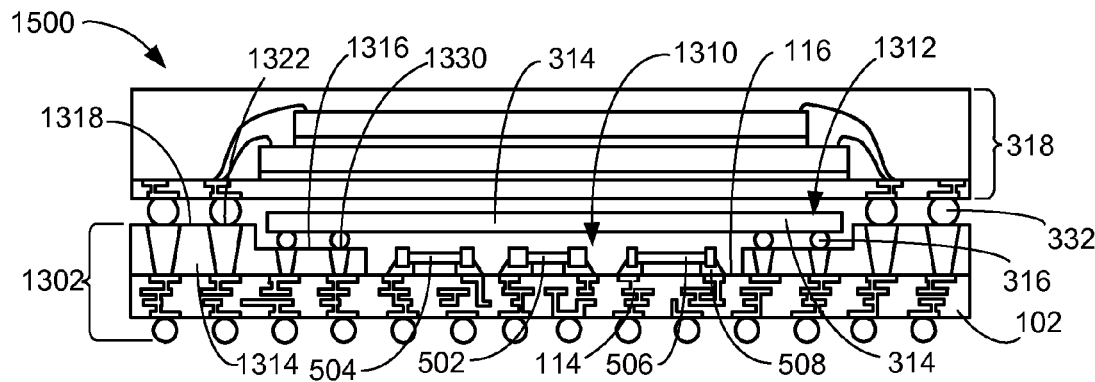
FIG. 15 is a cross-sectional view of an integrated circuit packaging system in a thirteenth embodiment of the present invention.

Referring now to FIG. 15, therein is shown a cross-sectional view of an integrated circuit packaging system 1500 in a thirteenth embodiment of the present invention. The integrated circuit packaging system 1500 is similar to the integrated circuit packaging system 1300 of FIG. 13 except the integrated circuit packaging system 1500 includes the first passive device 502, the second passive device 504, and the third passive device 506.

The first passive device 502 can be mounted centrally within the first cavity 1310 of the tiered encapsulant 1314. The second passive device 504 can be mounted within the first cavity 1310 of the tiered encapsulant 1314 and having an offset away from the first passive device 502.

The third passive device 506 can be mounted within the first cavity 1310 of the tiered encapsulant 1314 and having an offset away from the first passive device 502 and the second passive device 504.

The first passive device 502, the second passive device 504, or the third passive device 506, can be connected to the conductive material 114 exposed on the inner base side 116 of the base substrate 102 using the first module connectors 508.

The stack module 314 is shown mounted over the first passive device 502, the second passive device 504, and the third passive device 506. The stack module connectors 316 can connect the stack module 314 with the intermediate contact end 1330 substantially exposed on the intermediate horizontal side 1316 within the second cavity 1312 of the tiered encapsulant 1314.

The top package 318 is shown mounted over the base substrate unit 1302 and connected to the top contact end 1322 substantially exposed on the top horizontal side 1318 of the tiered encapsulant 1314 using the top package connectors 332. The top package connectors 332 can optionally be used to connect the top package 318 to the intermediate contact end 1330 of the intermediate horizontal side 1316.

Figure 16:
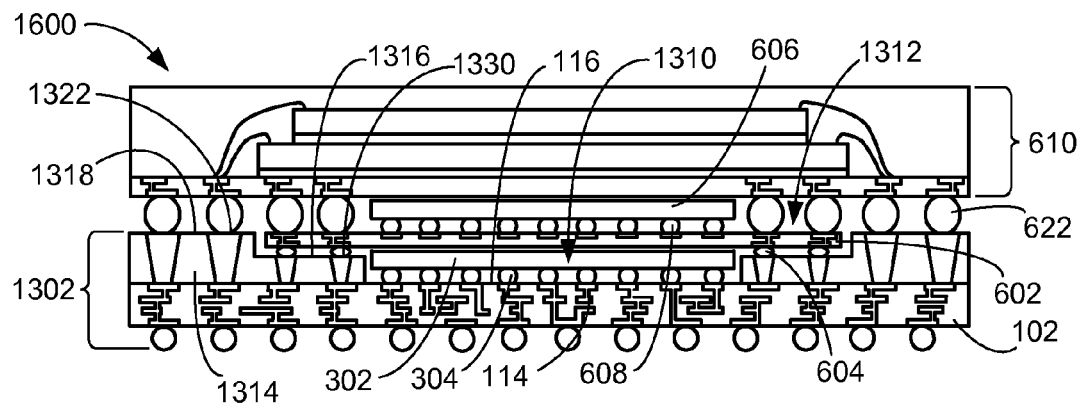
FIG. 16 is a cross-sectional view of an integrated circuit packaging system in a fourteenth embodiment of the present invention.

Referring now to FIG. 16, therein is shown a cross-sectional view of an integrated circuit packaging system 1600 in a fourteenth embodiment of the present invention. The integrated circuit packaging system 1600 is similar to the integrated circuit packaging system 1300 of FIG. 13 except the integrated circuit packaging system 1600 includes the stack substrate 602, the stack module connectors 604, the stack module 606, the substrate connectors 608, and the top package 610.

The base module 302 is shown mounted over or within the first cavity 1310 of the tiered encapsulant 1314 using the first module connectors 304 to connect the base module 302 to the conductive material 114 exposed on the inner base side 116 of the base substrate 102.

The stack substrate 602 can be mounted over the base module 302. The stack module connectors 604 can connect the side of the stack substrate 602 to the intermediate contact end 1330 substantially exposed on the intermediate horizontal side 1316 within the second cavity 1312 of the tiered encapsulant 1314. A side of the stack substrate 602 opposite the side with the stack module connectors 604 can be connected to an active side of the stack module 606 using the substrate connectors 608.

The top package 610 can be mounted or connected over the stack module 606 using the top package connectors 622. The top package connectors 622 can provide connectivity between the top package 610 and the top contact end 1322 substantially exposed on the top horizontal side 1318 of the tiered encapsulant 1314 or a portion of the stack substrate 602. The top package connectors 662 can optionally be used to connect the top package 610 to the intermediate contact end 1330 of the intermediate horizontal side 1316.

Figure 17:
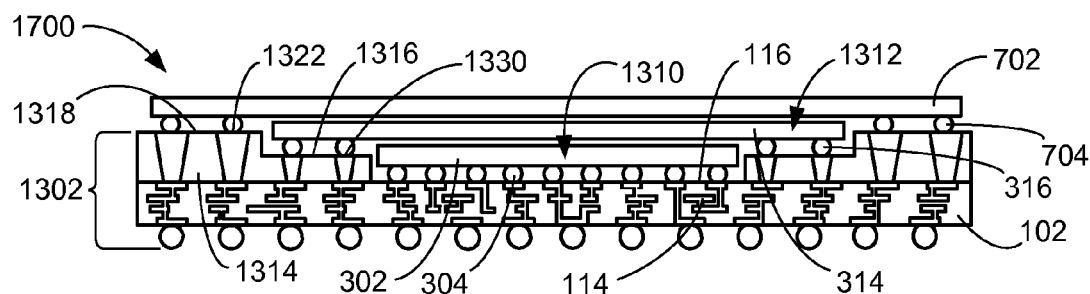
FIG. 17 is a cross-sectional view of an integrated circuit packaging system in a fifteenth embodiment of the present invention.

Referring now to FIG. 17, therein is shown a cross-sectional view of an integrated circuit packaging system 1700 in a fifteenth embodiment of the present invention. The integrated circuit packaging system 1700 is similar to the integrated circuit packaging system 1300 of FIG. 13 except the integrated circuit packaging system 1700 includes the top package 702 mounted or connected over the base substrate unit 1302.

The top package connectors 704 can connect an active side of the top package 702 to the top contact end 1322 substantially exposed on the top horizontal side 1318 of the tiered encapsulant 1314. The top package connectors 704 can optionally be used to connect the top package 702 to the intermediate contact end 1330 of the intermediate horizontal side 1316.

The stack module 314, below the top package 702, is shown connected to the intermediate contact end 1330 substantially exposed on the intermediate horizontal side 1316 within the second cavity 1312 of the tiered encapsulant 1314 using the stack module connectors 316.

The base module 302, below the stack module 314, is shown connected to the conductive material 114 exposed on the inner base side 116 of the base substrate 102 and over or within the first cavity 1310 of the tiered encapsulant 1314 using the first module connectors 304.

Any package structures from combinations of key features from the eleventh embodiment, the twelfth embodiment, the thirteenth embodiment, the fourteenth embodiment, or the fifteenth embodiment can be applicable.

Figure 18:
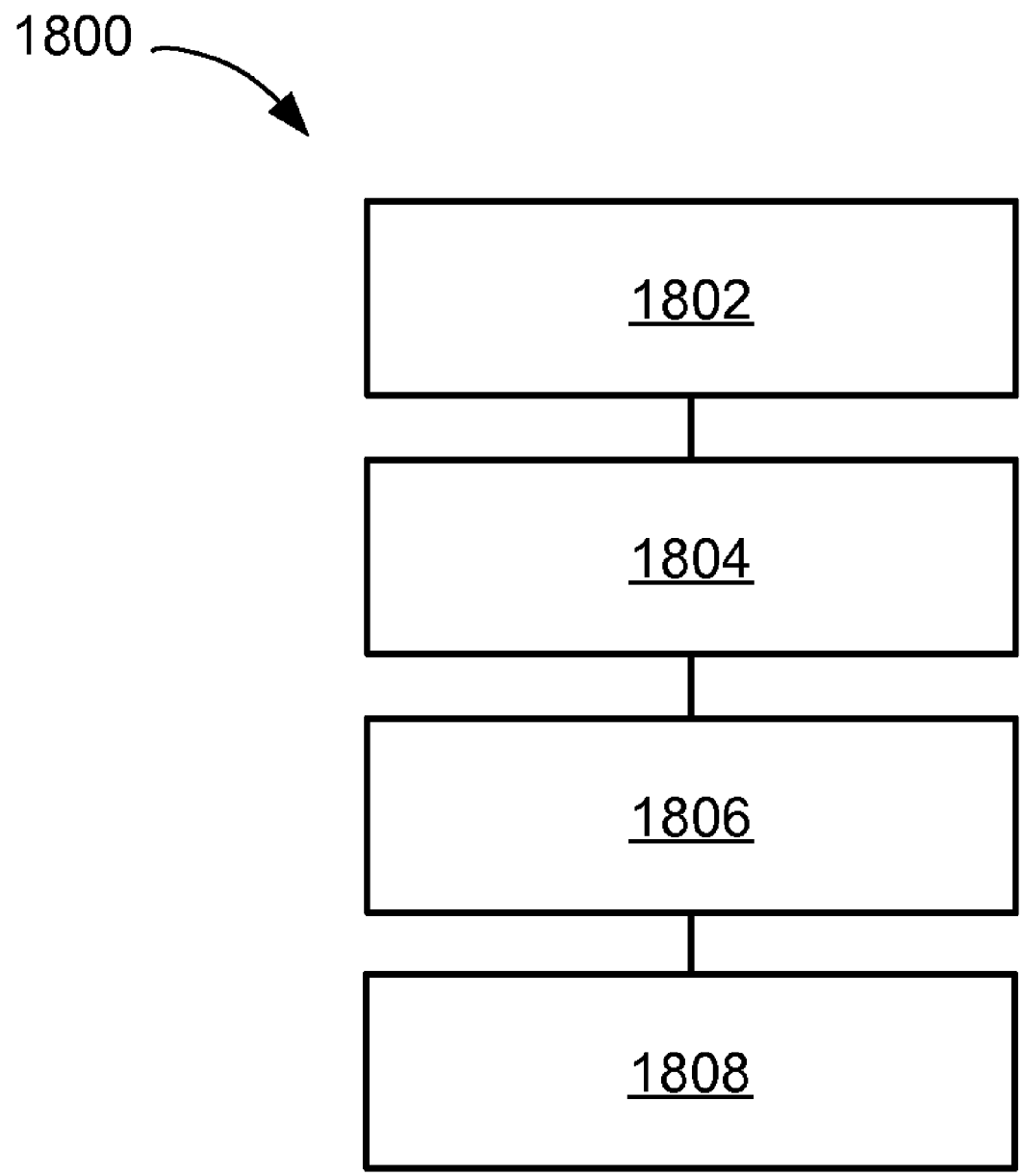
FIG. 18 is a flow chart of a method of manufacture of an integrated circuit packaging system in a further embodiment of the present invention.

Referring now to FIG. 18, therein is shown a flow chart of a method 1800 of manufacture of an integrated circuit packaging system in a further embodiment of the present invention. The method 1800 includes providing a base substrate in a block 1802; applying a tiered encapsulant above the base substrate, the tiered encapsulant having a first cavity above the base substrate and a second cavity above the first cavity adjacent an intermediate horizontal side in a block 1804; connecting an intermediate interconnect to the base substrate, the intermediate interconnect surrounded by the tiered encapsulant and substantially exposed on the intermediate horizontal side in a block 1806; and connecting a top interconnect to the base substrate, the top interconnect surrounded by the tiered encapsulant and substantially exposed on a top horizontal side in a block 1808.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing package in package systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a base substrate;
   applying a tiered encapsulant above the base substrate, the tiered encapsulant having a first cavity above the base substrate and a second cavity above the first cavity adjacent an intermediate horizontal side;
   connecting an intermediate interconnect to the base substrate, the intermediate interconnect surrounded by the tiered encapsulant and substantially exposed on the intermediate horizontal side; and
   connecting a top interconnect to the base substrate, the top interconnect surrounded by the tiered encapsulant and substantially exposed on a top horizontal side.

2. The method as claimed in claim 1 further comprising forming an intermediate through hole in the intermediate horizontal side having the intermediate interconnect in the intermediate through hole.

3. The method as claimed in claim 1 wherein:
   connecting the top interconnect includes connecting a lower interconnect of the top interconnect to the base substrate; and
   connecting an upper interconnect of the top interconnect exposed adjacent the top horizontal side to the lower interconnect.

4. The method as claimed in claim 1 further comprising forming a top through hole in the top horizontal side having the top interconnect in the top horizontal hole.

5. The method as claimed in claim 1 further comprising:
   connecting a base module to the base substrate of the first cavity;

connecting a stack module over the base module and to the intermediate interconnect; and connecting a top package over the stack module to the top interconnect.

6. A method of manufacture of an integrated circuit packaging system comprising:

providing a base substrate;

applying a tiered encapsulant above the base substrate, the tiered encapsulant having a first cavity above the base substrate and a second cavity above the first cavity adjacent an intermediate horizontal side;

connecting an intermediate interconnect to the base substrate, the intermediate interconnect surrounded by the tiered encapsulant and an intermediate contact end of the intermediate interconnect substantially exposed on the intermediate horizontal side; and connecting a top interconnect to the base substrate, the top interconnect surrounded by the tiered encapsulant and a top contact end of the top interconnect substantially exposed on a top horizontal side.

7. The method as claimed in claim 6 further comprising forming an intermediate through hole in the intermediate horizontal side having the intermediate interconnect in the intermediate through hole and the intermediate contact end substantially exposed on the intermediate horizontal side.

8. The method as claimed in claim 6 further comprising:

connecting a base module to the base substrate of the first cavity;

connecting a stack substrate over the base module and over the first cavity to the intermediate contact end;

connecting a stack module over the stack substrate to the stack substrate; and connecting a top package over the stack module to the stack substrate and the top contact end.

9. The method as claimed in claim 6 further comprising forming a top through hole in the top horizontal side having the top interconnect in the top horizontal hole and the top contact end substantially exposed on the top horizontal side.

10. The method as claimed in claim 6 further comprising connecting a passive component within the first cavity to the base substrate.

11. An integrated circuit packaging system comprising:

a base substrate;

a tiered encapsulant applied above the base substrate, the tiered encapsulant having a first cavity above the base substrate and a second cavity above the first cavity adjacent an intermediate horizontal side;

an intermediate interconnect connected to the base substrate, the intermediate interconnect surrounded by the tiered encapsulant and substantially exposed on the intermediate horizontal side; and a top interconnect connected to the base substrate, the top interconnect surrounded by the tiered encapsulant and substantially exposed on a top horizontal side.

12. The system as claimed in claim 11 further comprising an intermediate through hole in the intermediate horizontal side having the intermediate interconnect in the intermediate through hole.

13. The system as claimed in claim 11 wherein:

a lower interconnect of the top interconnect is connected to the base substrate; and an upper interconnect of the top interconnect is connected to the lower interconnect with the top contact end of the upper interconnect substantially exposed on the top horizontal side.

14. The system as claimed in claim 11 further comprising a top through hole in the top horizontal side having the top interconnect in the top horizontal hole.

15. The system as claimed in claim 11 further comprising:

a base module connected to the base substrate of the first cavity;

a stack module connected over the base module and to the intermediate contact end; and a top package connected over the stack module to the top interconnect.

16. The system as claimed in claim 11 wherein:

the intermediate interconnect has an intermediate contact end substantially exposed on the intermediate horizontal side; and the top interconnect has a top contact end substantially exposed on a top horizontal side.

17. The system as claimed in claim 16 further comprising an intermediate through hole in the intermediate horizontal side having the intermediate interconnect in the intermediate through hole and the intermediate contact end substantially exposed on the intermediate horizontal side.

18. The system as claimed in claim 16 further comprising:

a base module connected to the base substrate of the first cavity;

a stack substrate connected over the base module and over the first cavity to the intermediate contact end;

a stack module connected over the stack substrate to the stack substrate; and a top package connected over the stack module to the stack substrate and the top contact end.

19. The system as claimed in claim 16 further comprising a top through hole in the top horizontal side having the top interconnect in the top horizontal hole and the top contact end substantially exposed on the top horizontal side.

20. The system as claimed in claim 16 further comprising a passive component connected within the first cavity to the conductive material of the base substrate.

* * * * *